Jan. 18, 1966 W S HENRION 3,230,479

VARIABLE VOLTAGE CONTROLLED OSCILLATOR

Filed Sept. 29, 1961 3 Sheets-Sheet 1

INVENTOR.
W S HENRION

BY John E. Wagner

ATTORNEY

Jan. 18, 1966 W S HENRION 3,230,479

VARIABLE VOLTAGE CONTROLLED OSCILLATOR

Filed Sept. 29, 1961 3 Sheets-Sheet 2

INVENTOR.
W S HENRION

BY John E. Wagner

ATTORNEY

VARIABLE VOLTAGE CONTROLLED OSCILLATOR
Filed Sept. 29, 1961 3 Sheets-Sheet 3
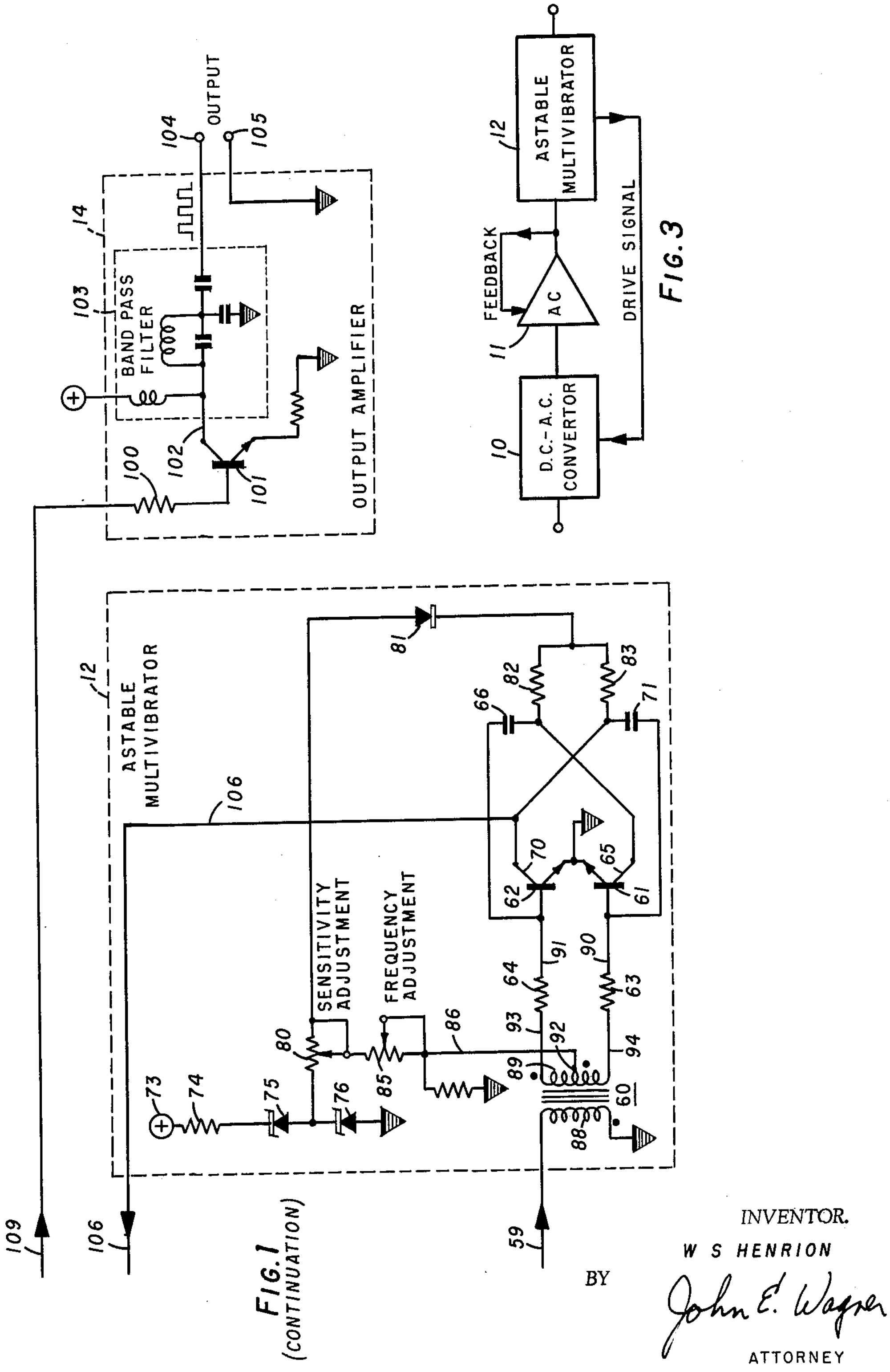
FIG. 1 (CONTINUATION), FIG. 3
INVENTOR.
W S HENRION
BY
John E. Wagner
ATTORNEY United States Patent Office 3,230,479
Patented Jan. 18, 1966

3,230,479
VARIABLE VOLTAGE CONTROLLED OSCILLATOR

W S Henrion, Reseda, Calif., assignor to The Bendix Corporation, North Hollywood, Calif., a corporation of Delaware Filed Sept. 29, 1961, Ser. No. 141,872
7 Claims. (Cl. 332—14)

This invention relates to telemetry apparatus, and more particularly to subcarrier oscillators for FM-type telemetry systems.

The heart of typical FM telemetry systems is the voltage-controlled oscillator which responds to varying D.C. levels applied to an input terminal to produce an output frequency which varies from a mean or center frequency by a deviation directly proportional to the magnitude of the input D.C. level. The output of the voltage-controlled oscillator is employed to frequency-modulate a carrier which in turn is transmitted by conventional transmission systems to a remote location.

In my Patent No. 3,178,658, I disclose a novel voltage-controlled oscillator having the advantages of small size and weight, temperature stability, and the capability of independent center frequency and input sensitivity adjustment. The voltage-controlled oscillator of my above-identified patent application and others of the art respond to input unidirectional voltage variations in a range of 1 to 10 volts to provide a corresponding frequency deviation. In numerous applications, however, common transducers generating the input signal to the oscillator exhibit over their range of operation voltage variations far less than the 1-to-10 volt range. Examples are strain gages or thermocouple transducers, which exhibit voltage variations in the order of 10 to 100 millivolts over their sensitivity range.

Heretofore, in order to drive the oscillators of FM telemetry systems with a low-level signal source, such as a thermocouple or strain gage, a D.C. amplifier has been inserted between the source and the oscillator. A simple D.C. amplifier employing direct coupling between stages has been found to be grossly insufficient for the purpose, since variations in supply voltage, temperature and other factors cause variations in the output of the amplifier which are interpreted as signals. Therefore, the D.C. amplifiers employed in such applications have been those which convert the D.C. input to A.C., amplify the A.C. with an A.C. amplifier employing negative feedback to provide stability, then by demodulating the amplified A.C., produce a D.C. signal proportional to the input signal. This output-amplified D.C. is then within the required input range of the oscillator and is applied directly thereto. D.C. amplifiers of this type require the use of a D.C. to A.C. convertor for converting the low-level input signal to A.C., an A.C. amplifier with feedback, a demodulator, a filter to remove the ripple, and means for driving both the D.C. to A.C. convertor and demodulator in precise synchronism. All of these elements of the D.C. amplifier necessary to raise the input signal level result in a relatively complex package of volume and weight and further can result in error signals if the feedback amplifier is not of careful design and manufacture, or if the synchronism between the D.C. to A.C. convertor and demodulator produced by the driver is less than complete. Therefore, a very real need exists for a voltage-controlled oscillator sensitive to input voltage variations in the order of a few millivolts. Despite the required sensitivity to signal low voltage variations, it is also essential that the oscillator have a high order of common mode rejection, i.e., a low sensitivity to voltage variations appearing between either of the input terminals and ground.

With this understanding of the state of the art, it is a general object of this invention to provide a voltage-controlled subcarrier oscillator responding to input signals in the millivolt range.

Another object of the invention is to provide a millivolt range oscillator which exhibits common mode rejection in the order of 100 to 140 db.

Still another object of this invention is to provide a millivolt oscillator which eliminates the need for a drive signal generator and a synchronous demodulator found in conventional low-level telemetry input circuits.

These objects are accomplished in accordance with this invention, one embodiment of which comprises a transistorized A.C.-D.C. convertor connected as the input stage of the oscillator to convert incoming signal voltages to an alternating voltage having an amplitude directly proportional to the input signal level. The convertor provides the input to an A.C. amplifier employing negative feedback for gain-stabilized amplification of the converted signal. The output of the A.C. amplifier is introduced as the control input to a voltage-controlled astable multivibrator of the general type disclosed in my above-identified patent application. The voltage-controlled oscillator output is applied directly to the FM transmission system as the frequency-modulated input signal. The multivibrator provides the convertor drive signal, thereby insuring synchronism between the voltage-controlled multivibrator and the convertor and eliminating the need for any separate convertor drive circuit.

The output of the A.C. amplifier therefore has an amplitude directly proportional to the input signal and a frequency equal to that of the oscillator, and therefore is applied directly to the multivibrator in its A.C. form. The synchronism between the multivibrator and convertor eliminates the necessity of the demodulation step required in D.C. amplifiers before applying the amplified D.C. level to the voltage-sensitive multivibrator.

One feature of this invention resides in the combination of a D.C.-A.C. convertor, A.C. amplifier and multivibrator as a low signal level voltage-controlled oscillator for FM telemetry systems.

Another feature of the invention resides in the provision for interconnections to derive the convertor drive signal from the multivibrator, thereby eliminating the necessity of a drive signal generator.

Another feature of this invention resides in the direct connection of the amplified A.C. signal to the multivibrator in a low-level FM telemetry oscillator without any intervening demodulator.

Still another feature of the invention resides in the D.C.-A.C. convertor having complete symmetry with respect to ground and a differential output connection whereby common mode signals and saturation voltages of the active elements are canceled.

These and other features of this invention may be clearly understood from the following detailed description and by reference to the drawing, in which:

FIG. 3 is a simplified block diagram of the system of this invention.

Figure 1:
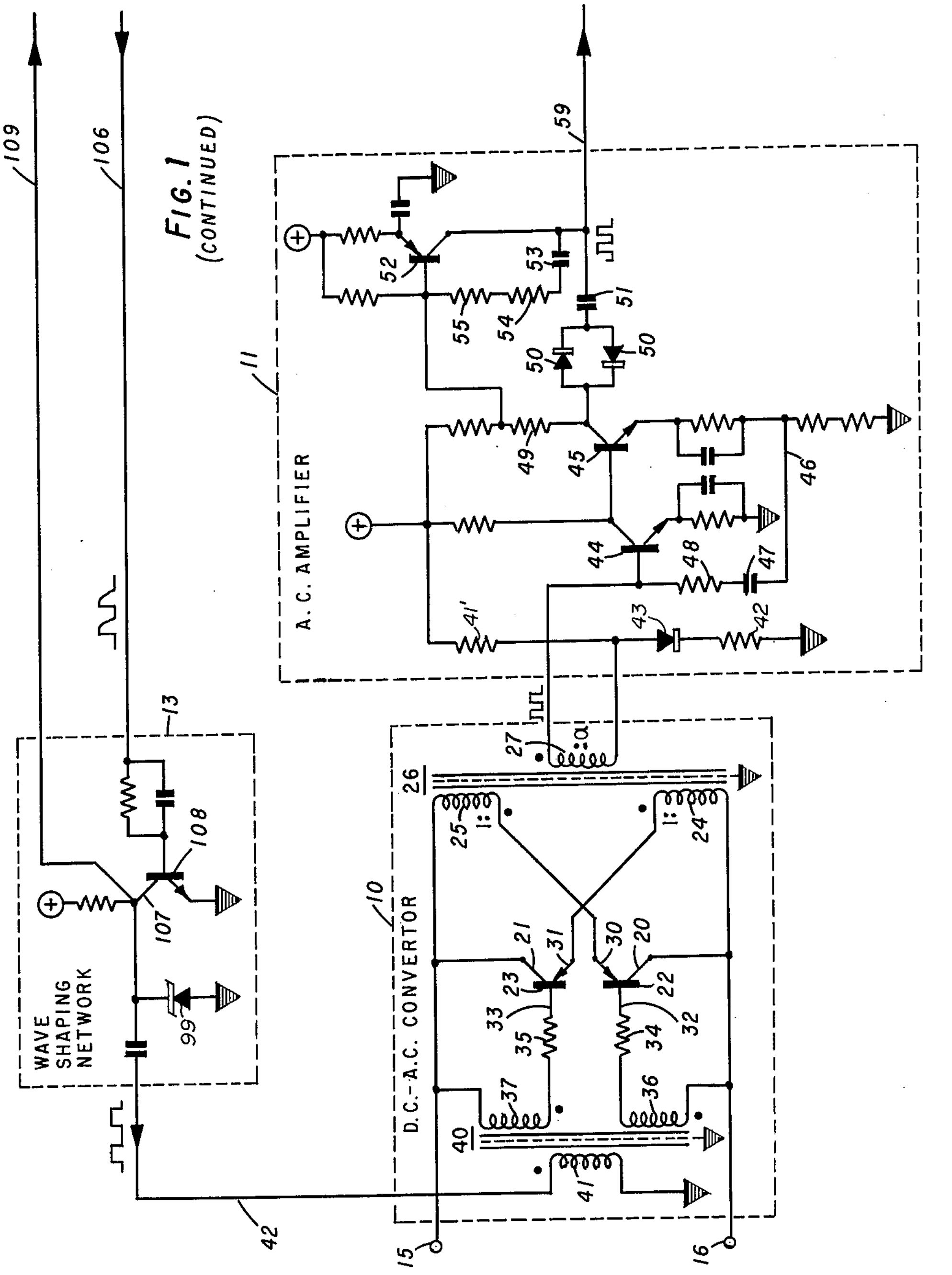
FIG. 1 is an electrical schematic representation of the oscillator modulator of this invention.

Now referring to FIG. 1, the oscillator of this invention comprises basically five elements, a D.C.-A.C. converter 10, an A.C. amplifier 11, a voltage-controlled astable multivibrator 12, a wave-shaping network 13, and an output circuit 14, each of which is identified by separate blocks in the drawing. The converter 10 includes a pair of input terminals 15 and 16 to which low-level signal voltages are applied in order to be introduced into the telemetering system. The low-level signals normally will vary over a range of 20 millivolts of either polarity. The source of these input signals applied to terminals 15 and 16 ordinarily is a strain gage, thermocouple, or other low-level transducer, not shown in the drawing. The terminals 15 and 16 are connected to respective collector electrodes 20 and 21 of the active elements, transistors 22 and 23 of the convertor 10. The collector electrodes 20 and 21 of transistors 22 and 23 are additionally connected to one side of respective primary windings 24 and 25 of a convertor output transformer 26. The emitter electrodes 30 and 31 are cross-connected to the opposite primary winding with the emitter 30 connected to primary 25 and emitter 31 connected to primary 24. The base electrodes 32 and 33 of respective transistors 22 and 23 are connected through base resistors 34 and 35 to respective secondary windings 36 and 37 of a convertor drive transformer 40. The primary winding 41 of the drive transformer 40 has one side grounded, and the opposite side forms the drive signal input over lead 42.

The convertor drive signal is a square wave of variable frequency corresponding to that of the multivibrator 12, and is introduced into the primary 41 of transformer 40. The secondary windings 36 and 37 of transformer 40 are connected between the collectors 20 and 21 and the base circuits of the transistors 22 and 23 to drive the two transistors 22 and 23, conducting and nonconducting, out of phase, as may be seen in FIG. 2 by comparing curves II and V.

From a comparison of curves III($a$) and VI($a$), it is apparent that when transistor 23 is in its conducting condition, transistor 22 is cut off, and a negative voltage shown in curve IV is developed across the primary winding 24 equal to the input signal across terminals 15 and 16 plus the saturation voltage of transistor 23. In this case the saturation voltage is shown as 3 mv. During the next half cycle, transistor 22 is saturated, and transistor 23 is cut off. During this second half-cycle a voltage (curve III($a$)) is developed across the primary winding 25 in series with the emitter 30 of transistor 22. This voltage is equal to the input signal minus the saturation voltage $V_{sat}$ of transistor 22, or 7 mv. The peak-to-peak voltage coupled into the secondary winding 27 of transformer 26 is then equal to the difference of the voltages developed on the primary side of transformer 26 times one over the turns ratio, $a$. The peak-to-peak secondary voltage therefore is equal to the total of the input voltage $V_{in}$ plus the saturation voltage of transistor 23, $V_{sat}$ minus the saturation voltage of transistor 22, $V_{sat}2$. It is seen from this that if the transistors 22 and 23 have saturation voltages which are equal they will cancel, and the secondary peak-to-peak voltage of transformer 26 will reduce to $2aV_{in}$. Similarly the leakage currents of the transistors 22 and 23 will cancel if equal. Therefore, the output curve VIII of the convertor 10 is an alternating voltage having a magnitude directly proportional to the magnitude of the signal voltage input applied to terminals 15 and 16 and having a frequency equal to the frequency of the drive voltage applied to its drive input through the lead 42.

Since the drive frequency actually is equal to the instantaneous frequency of the multivibrator 12, the period of each of the waveforms I–VIII varies with the input signal level. The plots ($a$) illustrate operation at the high-frequency band edge, the plots ($b$) the oscillator center frequency, and plots ($c$) the low-frequency band edge operation.

It should be noted from curves III($b$) and VI($b$) that in the no-signal condition the only voltages appearing between the emitter and collector electrodes of transistors 22 and 23 are the respective saturation voltages of approximately 3 mv. These voltages likewise appear across the respective primary windings 25 and 24 out of phase and equal in magnitude, producing a constant flux in the transformer core. The saturation voltages therefore cause no change in core flux and no induced voltage in the secondary. The output of the convertor 10 with no signal at terminals 15 and 16 therefore is zero (curve VIII($b$)).

The circuit symmetry, along with the balanced winding design of the transformers 40 and 26 plus the presence of effective electrostatic shielding between primary and secondary windings of those transformers, insures that any common mode signals developed between any portion of the circuit and ground are at a minimum and equal in both sides of the symmetrical circuit. Common mode signals are therefore balanced out at the secondary winding 27 of the output transformer 26.

The A.C. amplifier transformer 26 provides the signal input to the A.C. amplifier 11. This amplifier 11 is a three-stage negative feedback amplifier having a closed loop gain in the order of 48 db, and over-voltage protection in the form of clipping diodes.

The amplifier 11 includes a pair of directly coupled stages employing transistors 44 and 45 with feedback from the emitter circuit of transistor 45 to the base of transistor 44 through lead 46 and series capacitor 47 and resistor 48. A pair of resistors 41 and 42 and a temperature compensating diode 43 cooperate to provide a stable bias voltage for transistor 44. The output of transistor 45 taken from its collector circuit through a resistor 49 includes an amplitude limiter or clipper made up of a pair of oppositely poled parallel connected diodes 50 in series with a coupling capacitor 51. The third stage of amplifier 11 includes the transistor 52 with a feedback connection from the collector to base via capacitor 53 and two series resistors 54 and 55.

The amplified astable multivibrator signal produced by the amplifier 11 is coupled through lead 59, transformer 60 and resistors 63 and 64 to the base circuits of a pair of transistors 61 and 62. The transistors 61 and 62 are connected in common emitter configuration with the collector 65 of transistor 61 cross-coupled through a capacitor 66 to the base of transistor 62, and the collector 70 of transistor 62 is cross-coupled through capacitor 71 to the base of transistor 61 in conventional multivibrator practice.

Operating voltages for the multivibrator 12 are supplied from a source 73 through a voltage-dividing network including a resistor 74 and a pair of voltage-stabilizing Zener diodes 75 and 76, connected in series to ground. The collector voltage for the transistors 61 and 62 is derived through a variable resistor 80, a diode 81 and a pair of resistors 82 and 83.

The base supply for transistors 61 and 62 is derived through an adjustable resistor 85 used to adjust the center frequency of the multivibrator 12. The base voltage over lead 86 is supplied symmetrically to base electrodes 90 and 91 by a center tap connection 92 in the secondary winding of transformer 60.

The output voltage of multivibrator 12 is taken from collector 70 of transistor 62 over lead 106 and improved in wave shape by passage through network 13. The output of the wave-shaping network 13 on lead 42 is introduced to the primary 41 of driver transformer 40 as the driving voltage for the D.C.-A.C. convertor 10. This synchronizes the operation of the convertor 10 with the multivibrator 12, regardless of the frequency of the multivibrator 12 at any particular instant. The Zener diode 99 operates to "clip" or limit the amplitude of the converter input signal.

The square wave output of network 13 is taken from the collector 107 of transistor 108 and applied back through lead 109 and resistor 100 to an output amplifier 14 of the oscillator. The resistor 100 forms the base resistor of a transistor 101 operated as a simple amplifier with the output taken from the collector over lead 102 to a band-pass filter 103 having cut-off frequencies substantially coinciding with the upper and lower band edge for the particular normal operating frequency range of the oscillator. This band-pass filter 103 prevents interference by overlapping of adjacent subcarrier channels during wide frequency excursions. The output of the band-pass filter 103 is taken from terminals 104 and 105 and appears as a sine wave substantially free of harmonics and having a frequency deviation from the normal center frequency of the oscillator 12 varying linearly with the magnitude of the input signal at terminals 15 and 16 of convertor 10.

*Operation*

To understand the operation of the apparatus of this invention, it is first necessary to comprehend the mode of operation of the multivibrator 12. This oscillator is basically the type disclosed in my Patent No. 3,178,658, and a complete explanation of the operation and temperature-compensation features of that invention may be had by reference to the above-identified patent application. However, briefly, the following occurs with voltage supply 73 connected to the multivibrator and no signal being applied to the input terminals 15 or 16:

At one instant transistor 62 is biased to cut off, owing to the charge on capacitor 66, and transistor 61 is in saturation with base current flowing through resistor 63, the lower half of secondary winding 89 of transformer 60, the center tap connection 92, and lead 86 from the power supply 73.

The charge on capacitor 66 decreases as current flows through resistor 64 until the base-emitter junction of transistor 62 becomes forward-biased, and rapidly the transistor 62 switches from cut-off to saturated condition.

Figure 2:
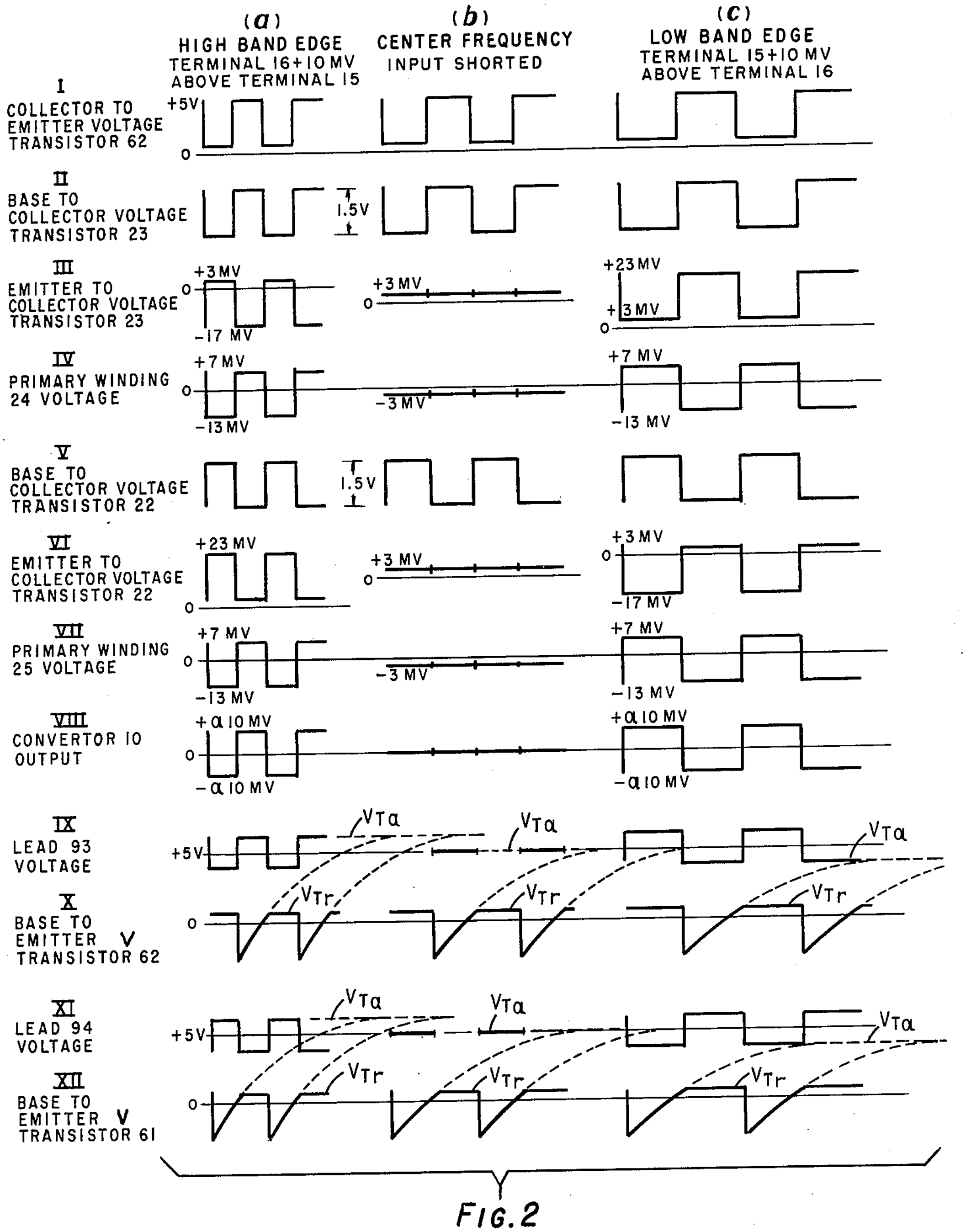
FIG. 2 is a graphical representation of the wave shapes of selected portions of the circuit of FIG. 1.

The voltage between the emitter and collector of transistor 62 drops, and the potential of both electrodes of capacitor 71 instantaneously follow. Transistor 61 is thereby cut off by the back bias supplied by capacitor 71. Charging current flows from the transformer 60 through resistor 63 to capacitor 71, charging the capacitor 71, and allows the voltage on the base electrode of transistor 61 to rise until it reaches a trigger voltage $E_{tr}$, at which time the two transistors 61 and 62 change state. The charging cycle of the base electrode of transistor 62 under no-signal conditions is shown in FIG. 2, curve X(*b*), as the curved solid line portion of the waveform. The charging curve, if extended as denoted by the dashed line, would approach as an asymptote a target voltage level $V_{ta}$ equal to the voltage on lead 93 (curve IX). Well before reaching the target voltage, however, the transistor 62 reaches saturation, as denoted by the flat portion of the waveform, where it remains in the saturated condition until being cut off upon conduction of transistor 61. The waveform XII(*b*) illustrates the similar charging cycle of the base electrode of transistor 61 180° out of phase with the cycle of transistor 62.

It should be noted by comparison of the waveform VIII, depicting the convertor 10 output with waveforms X and XII, that convertor 10 is synchronized with the multivibrator 12. This results since the output from the multivibrator 12 is used as the driving signal for the convertor 10.

*Signal modulation*

When a signal in the 0-to-20 millivolt range is applied to input terminals 15 and 16, that input signal is converted to A.C. in the convertor 10 as previously described and applied to the amplifier 11, from which it emerges as an A.C. signal having voltage excursions in the volt range rather than millivolt. This output of amplifier 11 is inserted between the base supply voltage over lead 86 and the base resistors 63 and 64 by A.C. coupling between the primary 88 and secondary 89 of the transformer 60.

Referring again to FIG. 2, the apparent target voltage $V_{ta}$ of the base waveform of transistor 61 is seen in curve XIII(*a*) to be increased by positive input signal during the charging cycle. The first half cycle period is determined by the rate of charge of the base circuit of transistor 61. Since the target voltage is increased during the charging cycle, the frequency increases (period decreases) during this half cycle. The second half cycle period is determined by the charging rate of the base waveform, curve X, of transistor 62. It is noted from FIG. 2 that during the second half cycle (with a positive input signal), the apparent target voltage $V_{ta}$ of the base waveform of transistor 62 has increased, causing an increase in frequency. From this, it is seen that the frequency of the oscillator is increased with the positive input signals. Similarly, as depicted by the family of waveforms (*c*), frequency of the oscillator is decreased by a negative or less positive input signal.

The oscillator 12, as described in my previous patent application, is a voltage-controlled oscillator which normally responds to a varying D.C. level applied to its signal input terminals to provide an output waveform having a frequency deviation varying linearly from a center frequency as a function of the D.C. input. In this application of this voltage-controlled oscillator, an A.C. signal from amplifier 11 instead is applied to the signal input. The A.C. signal, having an average D.C. of zero, normally would be expected to produce no frequency deviation of the multivibrator 12. However, the A.C. applied to the input terminals of the multivibrator 12 is synchronized with the instantaneous frequency of the multivibrator 12 so that the input to each base electrode of the transistors 61 and 62 is effectively a D.C. value during the charging cycle rather than A.C., and the D.C. level varies as a function of the millivolt signal input to the convertor 10. Consequently the oscillator effectively sees a varying D.C. input. An extremely important advantage is that this arrangement eliminates the need for a demodulator and its customary ripple form which ordinarily follows the A.C. amplifier stage of a typical telemetry D.C. amplifier. The feature of this invention which makes possible the elimination of the demodulator resides in the fact that the convertor 10 is driven by the voltage-controlled multivibrator 12. A simplified block diagram appears in FIG. 3, illustrating the operative relationship between the convertor 10, A.C. amplifier 11 and voltage-controlled multivibrator 12. The multivibrator may be considered to perform three functions in the operation of the invention: one, it generates the free-running or center frequency of the unit; two, it also provides the A.C. drive for D.C.-A.C. convertor; and, three, it eliminates the need for a synchronous demodulator for the amplified, inverted D.C. signals.

The net result of this invention is the simplification of the usual input circuit for low-level telemetry systems, and in the elimination or simplification of the design, enhanced reliability is likewise achieved. Lack of synchronization between the convertor and demodulator of a typical system cannot occur in this invention, because there is no demodulation step, and the convertor is driven by the controlled device, the multivibrator itself.

The convertor 10 itself is an important element in the successful operation of the oscillator, since by its symmetrical design it insures a high order of common mode signal rejection essential for accurate telemetry operation. The symmetry of the design is with respect to the signal path through the convertor 10. The signal input is through identical windings 36 and 37, bifilar wound in the driver transformer 40, through matched base resistors 34 and 35 to matched transistors 22 and 23. The output of the two transistors 22 and 23 likewise is symmetrical insofar as the signal path is concerned, with identical primary windings 24 and 25 also bifilar wound in transformer 26 connected between the emitter of one transistor and the collector of the opposite transistor.

Although for the purpose of explaining the invention a particular embodiment thereof has been shown and described, obvious modifications will occur to a person skilled in the art, and I do not desire to be limited to the exact details shown and described.

I claim:

1. A voltage-controlled oscillator comprising an input circuit including means for converting incoming signals to alternating signals having a period short by comparison to the rate of change and an amplitude proportional to the instantaneous level of the incoming signals, means for amplifying said alternating signals, a voltage-controlled astable multivibrator having resistance-capacitance networks providing a normal free-running frequency and a deviation from the free-running frequency proportional to the amplitude of signals applied to said networks, means applying the amplified alternating signals to said networks as the frequency deviating input thereto, and means for applying the output of said multivibrator to said converting means as the frequency-determining input for said converting means.

2. A voltage-controlled oscillator comprising:

a D.C. to A.C. converter including an information signal input and an alternating current drive signal input, said D.C. to A.C. converter responding to signals at said information input and at alternating drive signals of frequency greater than the rate of change of the information signal to produce an output alternating signal having a frequency equal to the drive signal frequency and an amplitude proportional to the instantaneous level of the information signal, an astable multivibrator including a pair of active elements, respective resistance and capacitance networks for said active elements and means for applying operating voltages to said active elements through said resistance-capacitance networks to provide a normal operating frequency which is a function of the magnitude of the operating voltage and the time constants of said resistance-capacitance networks, means for applying the alternating signal from said convertor to said resistance-capacitance networks to modify the operating voltage and thereby the frequency of the said multivibrator, and means for applying the output frequency of said multivibrator to the drive signal input of said D.C. to A.C. converter.

3. A voltage-controlled oscillator comprising:

a D.C. to A.C. convertor including an information signal input and an alternating current drive signal input, said D.C. to A.C. convertor responding to low-level signals at said information input and an alternating drive signal of frequency greater than the rate of change of the information signal to produce an output alternating signal having a frequency equal to the drive signal frequency and an amplitude proportional to the instantaneous level of the information signal, a feedback A.C. amplifier connected to the output of said D.C. to A.C. convertor to provide stabilized amplification of said output alternating signal, an astable multivibrator including a pair of active elements, respective resistance-capacitance networks for said active elements and means for applying operating voltages to said active elements through said resistance-capacitance networks to provide a normal operating frequency which is a function of the magnitude of the operating voltage and the time constants of said resistance-capacitance networks, means for applying the amplified alternating signal from said amplifier to the resistance-capacitance networks to modify the operating voltage and thereby the frequency of the said mutivibrator, and means for applying the output frequency of said multivibrator to the drive signal input of said D.C. to A.C. converter.

4. The combination in accordance with claim 3 wherein said multivibrator output is connected to drive said convertor in synchronism and substantially in phase with said multivibrator.

5. A voltage-controlled oscillator comprising a D.C. to A.C. convertor including a pair of information input terminals, a first transistor including base, emitter and collector electrodes, a second transistor including base, emitter and collector electrodes, the collector electrodes of said first and second transistor connected to respective input terminals, means for coupling an alternating drive signal to the respective base-collector circuits of said first and second transistors 180° out of phase, an output transformer for said convertor including a pair of primary windings wound to produce magnetic fields in opposite directions proportional to the amplitude of signals applied to said information input terminals, said windings connected between the emitter electrode of one transistor and the collector electrode of said opposite transistor, whereby saturation voltages and leakage currents of said transistors during alternate conduction cycles of said first and second transistor produce no flux changes in said output transformer and said convertor produces an alternating signal having a frequency equal to the frequency of an alternating drive signal coupled to said respective base-collector circuits of said convertor and an amplitude proportional only to the level of information signals applied to said information input terminals, an oscillator having a normal frequency of oscillation and a deviation from the normal frequency proportional to the instantaneous level of a D.C. signal applied to said oscillator, means applying said alternating signals to said oscillator as the frequency-deviating input thereto, and means for applying the output of said oscillator as the alternating drive signal for said D.C. to A.C. convertor.

6. In a voltage-controlled oscillator responding to slowly varying information signals to produce frequency deviations from a free-running or center frequency, an input circuit responding to input signals applied to a pair of input terminals but insensitive to common mode signals applied between either input terminal and ground comprising:

a first transistor including base, emitter and collector electrodes, a second transistor including base, emitter and collector electrodes, means for alternately forward-biasing to saturation and back-biasing to cutoff said first transistor at a rate substantially faster than the rate of change of information signals, means for alternately forward-biasing to saturation and back-biasing to cutoff said second transistor 180° out of phase with respect to the first transistor, an output transformer for said convertor including a pair of matched primary windings connected between respective emitter electrodes of one transistor and collector electrodes of the opposite transistor, said primary windings wound to produce magnetic fields in opposite directions, and a single secondary winding, and means for applying incoming low-level information signals between the collector electrodes of said first and second transistors whereby the signal transmission path through corresponding portions of the circuit of said first and second transistors is symmetrical with respect to ground.

7. A D.C. to A.C. convertor comprising:

a pair of information input terminals, a first transistor including base, emitter and collector electrodes, a second transistor including base, emitter and collector electrodes, the collector electrodes of said first and second transistor connected to respective input terminals, means for coupling an alternating drive signal to the respective base-collector circuits of said first and second transistors 180° out of phase, an output transformer for said convertor including a pair of primary windings, said windings connected between the emitter electrode of one transistor and the collector electrode of said opposite transistor, wound to produce magnetic fields in opposite directions proportional to the amplitude of signals applied to said information input terminals, whereby saturation voltages and leakage currents of said transistors during alternate conduction cycles of said first and second transistors produce no flux changes in said output transformer and whereby the convertor circuit symmetry insures balanced impedance between said input terminals and ground.

References Cited by the Examiner

UNITED STATES PATENTS

| | | | |
|---|---|---|---|
| 2,783,384 | 2/1957 | Bright et al. | 331—113 |
| 2,959,725 | 11/1960 | Younkin | 321—18 |
| 2,997,664 | 8/1961 | Jensen | 331—113 |
| 3,012,206 | 12/1961 | Burnside | 321—45 |
| 3,146,408 | 8/1964 | Nissim et al. | 332—14 X |

ROY LAKE, *Primary Examiner.*

JOHN KOMINSKI, *Examiner.*